United States Patent [19]

Lindbergh et al.

[11] Patent Number: 4,870,662
[45] Date of Patent: Sep. 26, 1989

[54] SYSTEM AND METHOD FOR COMPRESSING TRANSMITTED OR STORED DATA

[75] Inventors: David Lindbergh, Framinhgam; Brant M. Helf, Newtonville, both of Mass.

[73] Assignee: Concord Data Systems, Inc.

[21] Appl. No.: 127,129

[22] Filed: Dec. 1, 1987

[51] Int. Cl.$^4$ .......................... H04B 1/66; H03M 7/42
[52] U.S. Cl. ...................................... 375/122; 341/67; 341/107
[58] Field of Search ................ 375/122; 358/260, 261, 358/135; 340/347 DD; 341/67, 107

[56] References Cited

U.S. PATENT DOCUMENTS

| | | | |
|---|---|---|---|
| 4,075,622 | 2/1978 | Lawrence et al. | 340/347 DD |
| 4,168,513 | 9/1979 | Hains et al. | 340/347 DD |
| 4,464,650 | 8/1984 | Eastman et al. | 340/347 DD |
| 4,646,061 | 2/1987 | Bledsoe | 340/347 DD |

*Primary Examiner*—Robert L. Griffin
*Assistant Examiner*—Marianne Huseman
*Attorney, Agent, or Firm*—Hale and Dorr

[57] ABSTRACT

Disclosed is a system and method for compressing data that ranks received data characters according to their frequency of occurrence in the preceding data stream. Each time a character is input to the system, the table of rankings of each character is updated through use of a bubbler system, which does a simple exchange between the input character and a character. After a significant portion of data has been read, the table will substantially reflect the relative ranks of the various characters. A set of probability pointers divides the various ranks into several ranges, and each time a new character is input and the rank of that character is altered, the probability pointers are also updated. In this fashion, the system can readily adapt to change in the type of data in the input stream. On the decompression side, similar tables are set up, with the ranks and the probability pointers constantly being updated after the receipt of each coded symbols. A Coding table which is used to decode the symbols output by the system is also set up by the decompressor and updated periodically, but this updating is done every N input characters, where N is greater than or equal to 1.

25 Claims, 4 Drawing Sheets

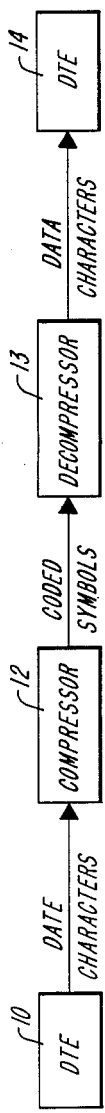

SYSTEM AND METHOD FOR COMPRESSING TRANSMITTED OR STORED DATA

BACKGROUND OF THE INVENTION

The present invention relates to a system and method for compressing data and more particularly to a system and method for compressing data that is stored or that is transmitted between remote points using dynamically generated compressed data code.

In recent years, significant effort has been expended in the development of systems and techniques for compressing data, either for data storage or for transmission from one unit of data terminal equipment (DTE) to another. Most codes used for data transmission, such as ASCII and EBCDIC, do not lend themselves to efficient packing of the most information into the least number of bits principally because they were designed for simplicity and not for efficiency.

Most codes use the same number of bits to send each character (generally seven or eight bits each). As a result, common characters like the space take just as many bits to send, and therefore just as much time, as infrequently sent or stored characters like the ampersand (&). Many data compression schemes reduce this transmission time by coding commonly sent characters with fewer bits than rarely sent characters. In other words, in a text file the letter "E" which is generally sent or stored more frequently than most of the other characters is sent in just two or three bits, while a character such as the exclamation mark (!) might be sent in ten or twelve bits. The net result is that on average, such systems take less time to send or store complete files than if the same number of bits were used for each character.

One well known compression technique is Huffman Coding, which provides optimal coding for discrete symbols from a limited set given two constraints. These constraints are that (1) the probability of the symbol occurring is independent of the preceding symbols, and (2) the probabilities of each symbol occurring are known. (The term "symbols", when used in connection with data compression, refers to the items to be coded, either for transmission or storage.) The coding scheme requires a finite set of these characters, and the probability of each symbol occurring must be known. Huffman Coding utilizes probabilities of the occurrence of each symbol in order to assign a unique bit sequence to code each symbol, with the more likely occurring symbols getting shorter bit sequences.

Huffman Coding requires that the probability of each symbol occurring not be influenced by the sequence of preceding symbols. In other words, in English text since certain characters such as "U" always follow a "Q" the likelihood of occurrence of each symbol is not represented solely by the overall probability of the occurrence of that symbol, and for this reason coding schemes that do not take such factors into account are not perfectly optimal. A greater optimization of the coding may be obtained by choosing larger symbols, such as "QU". This optimization, however, is achieved at the expense of a much more complex and time consuming system which would not be practical if it is to be used in a data communications device which is intended to operate in real time.

An even greater drawback associated with systems utilizing Huffman Coding is the requirement that the probabilities of each symbol occurring be known. This constraint requires that a Huffman Coding system be essentially a two pass process. The first pass examines the data to determine the probability of occurrence of each symbol with the Huffman Coding based on the probabilities, and the second pass actually encodes and transfers the data. To achieve a worthwhile system, data must be held back from transmission in order to get enough probability data to be statistically significant. The holding back of data, however, introduces transmission delays unacceptable in full duplex, interactive communications. Further, the coding tables would also be required to be sent to the receiver in order to decompress the data, and any bits required to transfer coding tables must be subtracted from the gains made from the compression process itself.

It is therefore a principal object of the present invention to provide a system and method for compressing data in one pass that is fully adaptive so that the transmitter determines which characters are most common and to what degree.

Another object of the present invention is to provide a system and method for compressing data that operates without static probability tables and without the transmission of coding data.

It is a further object of the present invention to provide a system and method for compressing data that will efficiently operate with half or full duplex modems used for batch or interactive communication.

SUMMARY OF THE INVENTION

Accordingly, the system and method of the present invention for compressing data ranks received data characters according to their frequency of occurrence in the preceding data stream. Each time a character is input to the system, a table of rankings of each character is updated through use of a bubbler system, which performs a simple exchange between the input character and a higher ranked character. After a significant portion of data has been read, the table will substantially reflect the relative ranks of the various characters. A set of probability pointers, that measure the amount of the difference in probabilities between ranges, divides the various ranks into several ranges of ranks. Each time a new character is input and the rank of that character is altered, the probability pointers are also updated. In this fashion, the system can readily adapt to changes in the type of data in the input stream. On the decompression side, similar tables are set up, with the ranks and the probability pointers constantly being updated after the receipt of each coded symbol. A Coding Table which is used to decode the symbols output by the system is also set up by the decompressor and updated periodically, but this updating is done every N input characters, where N is preferably greater than 1.

BRIEF DESCRIPTION OF THE DRAWINGS

FIG. 1 is a schematic view of the components of a data transmission system utilizing the data compression system and method of the present invention;

FIG. 2 is a diagram of the RANK and CHAR tables used by the system and method of the present invention;

FIG. 4b is a flow chart of an alternative embodiment of the operation of the updating of the probability pointers shown in FIG. 4a;

DETAILED DESCRIPTION OF THE PREFERRED EMBODIMENTS

Figure 3:
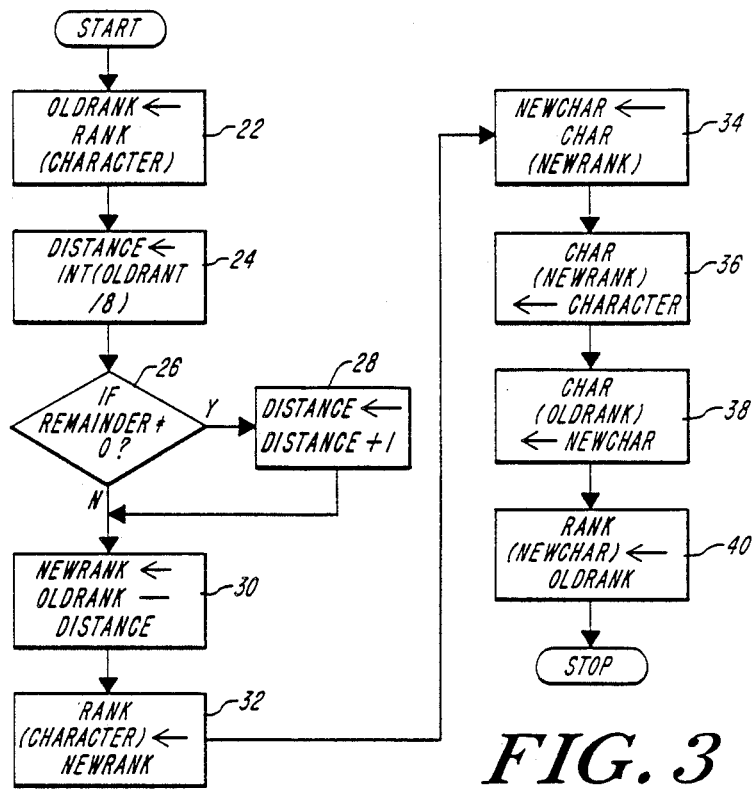
FIG. 3 is a flow chart of the operation of the bubbler procedure used by the system shown in FIG. 1.

A general overview of the system and method of the present invention will be provided first in order to facilitate an understanding of the details of each element of the system. In a preferred embodiment, the data compression system of the present invention takes as its "symbols" the 256 possible eight bit characters. Each symbol is considered statistically independent of all other symbols, and the tendencies of certain characters "such as letters" to follow others, as in common two or three character sequences, are not taken into account. This feature while having the disadvantage of sacrificing performance provides the advantage of producing a simpler, smaller and faster data compression system.

Using a single-pass method of efficiently coding data, the system is fully adaptive to both character content and frequency distribution of the data being compressed. The character content of data is concerned with which particular characters are the most common characters in the data stream, and the frequency distribution provides an indication of the relative occurrence of characters in the stream. The system uses separate mechanisms to keep track of the character content and frequency distribution.

Each character being compressed is coded into a symbol ranging from one to 16 bits in length. A symbol includes a prefix part and a suffix part with the prefix being 1 to 8 bits in length and consisting of 0 to 7 "1" bits terminated by a single "0" bit. This prefix determines the interpretation of the suffix which is also 0 to 8 bits in length.

In one embodiment, the 256 possible 8 bit characters are stored in order of decreasing probability by an adaptive "bubbler" mechanism which does not keep track of the probability of individual characters. Rather, the bubbler tracks which particular characters in the data stream are most common. The rankings are divided into 8 coding ranges, numbered 0 through 7, by "probability pointers" which give the rank below which the combined probability is ½, ¼, ⅛, 1/16, 1/32, 1/64, and 1/128. The pointers are adjusted with each character processed to adapt to the difference in probability between characters in each range. The rankings in the ranges between each probability pointer are all coded with symbols of the same number of bits. The prefix of each symbol is the "range number" (0 to 7) bits terminated by a single "0" bit. The number of rankings in each range determine the number of bits of each suffix, which acts as an offset from the probability pointer to the individual rank. Both the bubbler and the probability pointers are updated after each character is processed so that the coding scheme is continually changing to follow the characteristics of the actual data handled.

The transmitter and receiver each start with identical bubbler and probability pointer states and modify them in exactly the same way as the data is processed. The changing status of each side of the connection exactly matches the other without the contents of the bubbler or probability pointers ever being transferred. In addition, in a duplex connection, the entire compression system is duplicated for data moving in each direction.

Turning now to a more detailed description of the components, the bubbler mechanism, which performs the first step in the compression process, keeps track of which characters are most common in the data. In one embodiment, as shown in FIG. 2, the bubbler maintains two tables in memory, each with entries for all possible 8 bit characters (i.e., in the described embodiment, 256 entries). The Rank table 16 maintains a ranking of the probability of occurrence of each possible 8 bit character indexed by character value (0–255). The Char table 18 which is complementary to the Rank table 16, keeps track of the character assigned to each possible rank in the rank table, indexed by rank number (0–255). The Rank and Char tables of the bubbler represent only an ordering of the probabilities of occurrence of each character. As described herein, the system assigns the most common character a rank of "0" and the least common character a rank of "255".

Each time the system receives a character to be compressed, the rank of that character is looked up in the Rank table using the character vale as the index to the Rank table. The system utilizes this rank for the remainder of the compression routine, and it is this rank that will be encoded for transmission.

When a rank value is received in a decompression process, the character that the rank represents is looked up in the Char table, and the character assigned to the transmitted rank is the output character.

After each character is processed by the compression routine, the bubbler updates the Rank and Char tables based on the character just processed. Ideally, the system adapts the Rank and Char tables so they represent an accurate, as nearly as possible, statement of the ordering of probabilities of the characters. This ordering may be achieved, as will be described in greater detail below with reference to FIG. 3, by swapping the ranking of the character just processed with the ranking of the character that is ⅛ of the remaining distance to the top. For example, if the character just processed had a rank of 47 the new rank of that character would become 41 and the character that used to have a rank of 41 would get the rank of 47. As a result, frequently used characters tend to "bubble" toward the top of the rankings and rare characters fall toward the bottom.

One procedure used by the bubbler for updating the tables will now be described with reference to FIG. 3. Initially, after a new character has been received, the rank of that character is fetched from the Rank table and stored as the original rank in step 22. In step 24, this rank is divided by 8 to find the distance the rank is to be shifted. It is the integer value of this distance which is taken in step 24, and if the remainder of this division is not equal to 0, the bubbler increments by 1 the distance the rank is moved in step 28. The new rank is equal to the old rank minus the distance as calculated in step 30, and in step 32 the location in the Rank table for that character is assigned the new rank. The character being displaced is temporarily stored in step 34, and in step 36 the character being processed is placed in its new location in the Char table. In step 38, the displaced character is placed in its new location in the Char table, and the rank of the displaced character is updated in step 40.

The rank of each character can most speedily be divided by 8 by shifting the rank right by 3 bits. The remainder of the division can be found by ANDing the original rank with 7. In the procedure just described if the remainder of the division is non-zero the ⅛ distance is rounded up the next ranking. This ensures both that characters will continue to bubble up one rank at a time, even when the rank is above 8, and that the top-ranked character, with rank of 0, will not receive a negative rank.

This procedure utilized by the bubbler finds its primary advantage in the fact that it executes very quickly and produces a reasonably accurate ordering f the characters while adapting to the data at a reasonably swift rate.

On the negative side, this procedure sometimes causes characters to "fight" with each other on the way to the top. Two or more common characters can slow each other down by constantly swapping with each other, rather than with uncommon characters. This happens most frequently with data of very low information content, especially when the data includes a few characters that are constantly repeated in the same pattern. In virtually all "real world" data this is not a problem, however, because the randomizing effects of the information content cause the popular characters to "miss" each other in the bubbler.

As an alternative to the operation of the bubbler described with reference to FIG. 3, the bubbler may utilize a true bubble sort. In addition to the Rank and Char tables, this embodiment utilizes a Count table that maintains a count of the number of occurrences of each character. The Rank and Char tables are set in the same manner as in the embodiment of FIG. 3, and the Count Table is initially set to 0 occurrences for each possible character from 0 to 255. After each character is processed, the count value for that character is increment by one. The characters are then sorted by count values, and the rank numbers assigned in order from highest count to lowest. This sorting is done by comparing the just incremented count value for the character just processed to the count value for the character immediately above it in the Char table. If the count of the current character is now greater, the Rank values for the two characters are swapped. The count value of the current character is then compared again with that of the character ranked above it, and the ranks are swapped if the count of the current character is higher. This continues until the count of the current character count is no longer greater than the count of the character ranked above it.

After the ranks have been sorted, the count of the current character is compared to 64. If the count has reached 64, all of the count table entries are divided by 2. This is an integer divide with the remainder thrown away, and this division can be more swiftly accomplished by shifting each count table entry one bit to the right. This has the desirable effect of limiting the size of the count value fields and facilitating reasonably swift adaptation.

Although this alternative embodiment provides a more accurate ordering of character probability than the embodiment described in connection with FIG. 3, it is slower. As a result, before deciding which form of operation is appropriate for the bubbler mechanism, an evaluation of the uses of the data communication device incorporating the compression system should be evaluated.

In addition to the bubbler mechanism, the system also utilizes a set of probability pointers for measuring the degree to which some characters are more common than others. In a preferred embodiment in which there are 256 possible characters, there are 7 probability pointers which can be thought of as pointing into the Char table and dividing it into 8 "probability ranges". The pointers indicate the positions in the Char table below which the total probability for the least likely characters are ½, ¼, ⅛, 1/16, 1/32, 1/64, 1/128. The pointers are numbered from 0 to 6. The particular positions are chosen so that each probability range will have one-half the total probability of the previous range, thus compensating for the extra bit in the prefix for that range. The probability pointers are the basis upon which the Coding table, which determines the exact length and interpretation of the suffix for each probability range, is constructed.

The pointers themselves are 16 bit numbers. In one embodiment the most significant byte (MSB) of the 16 bit number represents the whole number part of the calculated rank, and the least significant byte (LSB) represents a fractional part of the calculated rank. This organization allows pointers to be adjusted in increments of less than one character at a time. In this scheme a difference of 256 in the value of a pointer is equivalent to a whole character. A hexadecimal value such as C25B would be interpreted as a whole character C2 with fraction 5B or 194.355468750 in decimal (the fraction in 91/256).

All seven pointers are updated after each character is processed by the compressor. It is the rank of the characters that is significant, not the characters themselves. Each pointer maintains its proper level by having an appropriate value added to it if the rank is below the pointer, or a value subtracted from it otherwise. The amounts added and subtracted are proportional to the probability being sought by the pointer. Note that adding to a pointer moves it toward the bottom of the Char table and subtracting from a pointer moves it toward the top of the Char table.

Figure 4A:
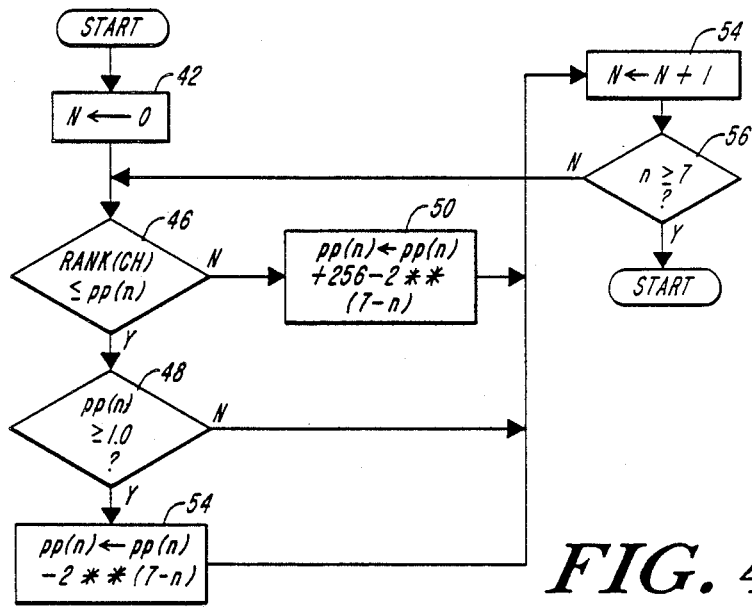
FIG. 4a is a flow chart of the operation of the updating of the probability pointers performed by the system of FIG. 1.

Referring to FIG. 4a, the system updates the probability pointers for each of the pointers in the following manner. After initializing the pointer index in step 42, the system checks, in step 46, if the rank of the character just processed is less than or equal to the probability pointer (or the most significant byte of the probability pointer) and if it is, in step 48, the system checks if the probability pointer is greater than or equal to 1.0. If both conditions are true, the probability pointer is decreased by $2^{(7-N)}$ in step 52. This decrease actually moves the pointer up in the table. If instead, the rank of this character is greater than the probability pointer, the probability pointer is increased by the quantity $256 - (2^{7-N})$ in step 50. (It should be understood that either the MSB or the entire pointer can be used in this process.) Step 54 causes the system to consider the next pointer, and if all of the pointers have not been processed, step 56 causes the same procedure to be performed for each pointer until all the pointers have been processed.

The limitation prohibiting a further decrease of the pointer if the probability pointer is not greater than or equal to 1.0 prevents the pointer from underflowing and "wrapping around" the Char table when the character with the rank of 0 occurs again. Table 1 shows the various adjustments made to the probability pointers.

TABLE 1

| PROBABILITY POINTERS | | Increase by | Decrease by |
|---|---|---|---|
| Number | Level | 2**(7-N) | 256-(2**7-n) |
| 0 | 1/2 | 128 | 128 |
| 1 | 1/4 | 64 | 192 |
| 2 | 1/8 | 32 | 224 |
| 3 | 1/16 | 16 | 240 |
| 4 | 1/32 | 8 | 248 |
| 5 | 1/64 | 4 | 252 |
| 6 | 1/128 | 2 | 254 |

These probability pointers demarcate the following eight probability ranges:

TABLE 2a

| Number | Range | Total Probability |
|---|---|---|
| 0 | Rank 0 to 1/2 pointer | 1/2 |
| 1 | 1/2 pointer to 1/4 pointer | 1/4 |
| 2 | 1/4 pointer to 1/8 pointer | 1/8 |
| 3 | 1/8 pointer to 1/16 pointer | 1/16 |
| 4 | 1/16 pointer to 1/32 pointer | 1/32 |
| 5 | 1/32 pointer to 1/64 pointer | 1/64 |
| 6 | 1/64 pointer to 1/128 pointer | 1/128 |
| 7 | 1/128 pointer to Rank 255 | 1/128 |
| | Total | 1.0 |

In the embodiment described with reference to FIG. 4a, ranks in the 7th probability range were coded with an 8 bit prefix (11111110), and usually an 8 bit suffix, for a total of 16 bits. Approximately 1 rank in 128 was coded this way. The unusually long suffix is caused by the fact that typical data includes less than 128 unique characters so the distance from the last probability pointer to rank 255 is usually greater than 128. Allowing for this number of possible ranks in the final coding range requires an 8 bit suffix. In most cases, however, only a very few ranks are actually coded in the final coding range, as the other possible characters never occur. Thus when the last coding range is used an unnecessarily long suffix is sent, resulting in a slight degradation in performance.

Figure 4B:
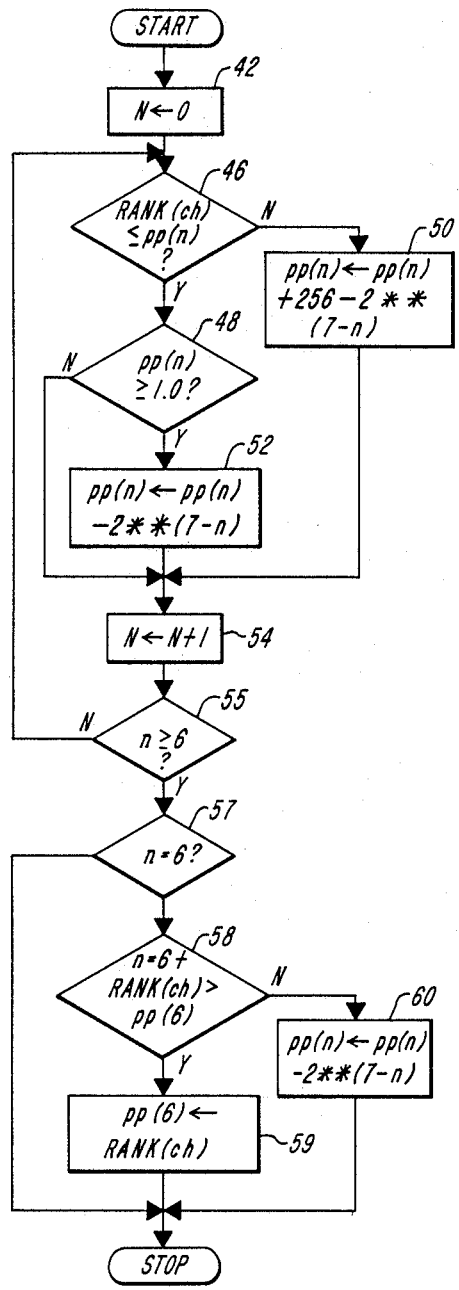

Referring to FIG. 4b an alternative embodiment of the present invention avoids this problem by adopting an improved method of updating the last probability pointer, number 6. The operation of this method is the same as FIG. 4a, until the 6th pointer is processed. If probability pointer number 6 is greater than or equal to 1.0, the probability pointer is decreased by 2. If, however, the rank of the character is greater than the probability pointer number 6, the pointer is assigned the rank value of the character and the least significant byte of the probability pointer is set to 0.

As a result, the last pointer moves up as in the case of FIG. 4a, but the pointers always move down to exactly the level of any rank below it. This tends to keep the last probability pointer just below all the rankings actually used in the data. The last pointer therefore can be thought of as pointing to the bottom of the active ranks in the rank table. While the last coding range still uses 16 bit symbols most of the time, this range is now hardly ever used since the least used rankings are now included in probability range 6 most of the time. The symbols for these characters have fewer bits than they did under the system of FIG. 4a, and the final coding range is still available for new characters when they occur in the data. The probability ranges from this method are as follows:

TABLE 2b

| Number | Range | Total Probability |
|---|---|---|
| 0 | Rank 0 to 1/2 pointer | 1/2 |
| 1 | 1/2 pointer to 1/4 pointer | 1/4 |
| 2 | 1/4 pointer to 1/8 pointer | 1/8 |
| 3 | 1/8 pointer to 1/16 pointer | 1/16 |
| 4 | 1/16 pointer to 1/32 pointer | 1/32 |
| 5 | 1/32 pointer to 1/64 pointer | 1/64 |
| 6 | 1/64 pointer to bottom pointer | 1/64 |
| 7 | Bottom pointer to Rank 255 | 0 (approximately) |
| | Total | 1.0 |

After updating the probability pointers, the Coding Table sometimes must also be updated. The Coding Table specifies the actual coding of rank values into variable rank prefix/suffix bit patterns for output and directs the decoding of received bit patterns into rank values. The Coding Table is periodically generated based on the values of the probability pointers.

The Coding Table itself has eight entries, one for each of the probability ranges demarcated by the probability pointers. The table stores two items for each range: the number of the first ranking in that range and the number of bits in the suffix for ranks in that range. Table 3 shows a sample Coding Table:

TABLE 3

| Range # | Base Rank | # Bits |
|---|---|---|
| 0 | 0 | 3 |
| 1 | 8 | 3 |
| 2 | 16 | 2 |
| 3 | 20 | 3 |
| 4 | 28 | 3 |
| 5 | 36 | 3 |
| 6 | 44 | 5 |
| 7 | 76 | 8 |
| | (256) | |

The prefix part of each compressed symbol consists of a number of "1" bits terminated by a single "0" bit. The "range#" column is actually the index into the table and not part of the table itself. It specifies the number of "1" bits in the prefix for that range. Thus, the prefix of symbols in range 5 is "111110", for a total of six bits. The prefix of symbols in range 0 is "0", a single bit prefix. On reception of a coded symbol, the number of "1" bits found before the terminating "0" bit tells the decompressor 13 which coding table range to use to decode the suffix.

The "base rank" field of each entry in the Coding Table indicates the lowest numbered ranking contained in that coding range. The system derives these rankings from the values of the probability tables, but these rankings are not identical to the values of the probability pointers. The "#bits" field is the antilog, to the base of 2, of the number of rankings in that range. This number represents the number of suffix bits needed to count that number of symbols.

For example, suppose the code for rank 34 is to be generated using the Coding Table provided in Table 3 above. Coding range 4 has a base rank of 28, and a "#Bits" of 3 so that there are $2^3$ or 8 rankings in that range starting with 28 and going through 35. Therefore, rank 34 is in coding range 4 and its prefix will be "11110". The suffix will be 3 bits in length, and is treated as an offset from the base rank of the range. As $34 - 28 = 6$, the suffix is "110" binary. In a preferred embodiment, the suffix is coded "backwards" with the least significant bit first so the coded suffix is "011". The complete compressed symbol for rank 34 is then "11110011", an 8 bit symbol.

As a further example, the coding for rank 4 is determined as follows. Coding range 0 has a base range of 0 (it always does) and a "#Bits" of 3 so that this range also includes 8 rankings, with the range this time being between 0 and 7, which, of course, includes 4. The prefix will have zero "1" bits followed by a "0", and therefore is simply "0", and the suffix will be a three bit offset from the base rank 0. Binary 4 is "100" which backwards is "001" thus the complete coding is "0001".

Although there are eight entries in the Coding Table, under some probability pointer conditions, the system actually uses fewer than eight of these entries. The Coding Table shown below in Table 4 is based on the ASCII string "THIS IS A TEST" repeated

TABLE 4

| Range # | Base Rank | # Bits |
|---|---|---|
| 0 | 0 | 1 |
| 1 | 2 | 0 |
| 2 | 3 | 4 |
| 3 | 19 | 8 |
| 4 | (256) | x |
| 5 | x | x |
| 6 | x | x |
| 7 | x | x |

In this example, the system only uses the first four coding ranges as the table was created based on just seven different characters repeated over and over. Table 4 generates the following (selected) codings.

TABLE 5

| Rank | Prefix | Unreversed Suffix | Complete Symbol |
|---|---|---|---|
| 0 | 0 | 0 | 00 |
| 1 | 0 | 1 | 01 |
| 2 | 10 | (none) | 10 |
| 3 | 110 | 0000 | 1100000 |
| 4 | 110 | 0001 | 1101000 |
| 5 | 110 | 0010 | 1100100 |
| 18 | 110 | 1111 | 1101111 |
| 19 | 1110 | 00000000 | 111000000000 |
| 255 | 1110 | 11101100 | 111000110111 |

Of these codings, coding range 0 has a single bit suffix so it can only code ranks 0 and 1. Coding range 1 has no suffix at all, it codes rank 2 only. Range 2 codes ranks 3 through 18, and range 3 codes the rest of the 256 possible ranks.

In a situation like the one presented in the Tables 4 and 5, the system must somehow detect the end of the coding table. In one embodiment, the system creates an "extra" base rank figure of 256 after the last used coding range. This could be done with a "0" (the 8 least significant bits of 256) if the field that stores the base rank is only eight bits wide.

Figure 5:
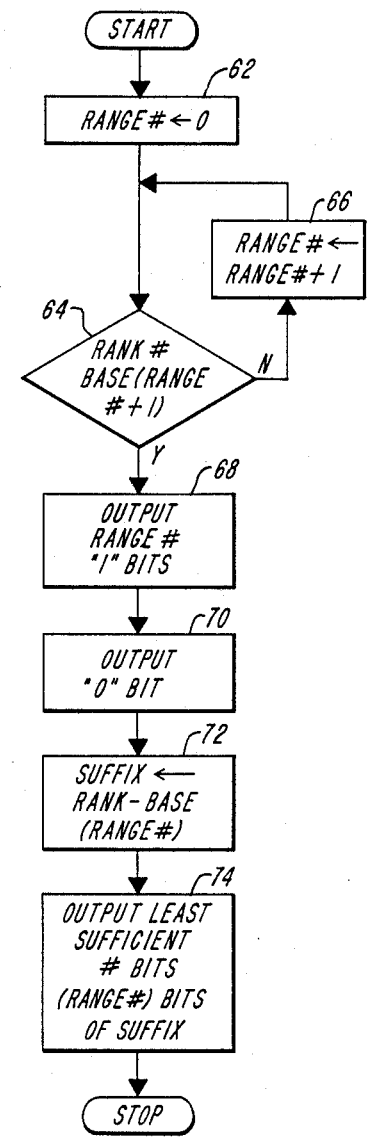
FIG. 5 is a flow chart of the encoding steps used by the system and method of the present invention.

Referring to FIG. 5, the procedure utilized for encoding each character requires the "base rank" of the Coding Table in Base(), "#Bits" in #BITS() and Rank to find the proper coding for any given rank number. In step 62 the system is initialized to begin with range "0", and in step 64 the system tests whether the right range has been found. If it has not been found, the next range is tested until the correct range for the given rank number is found. Once the correct range is found, the system outputs the "1"s for the prefix in step 68, and in step 70 the terminating "0" bit for the prefix is output. In step 72 the system determines how far the suffix is from the base and then outputs, in step 74, the suffix in least significant bit first order.

Figure 6:
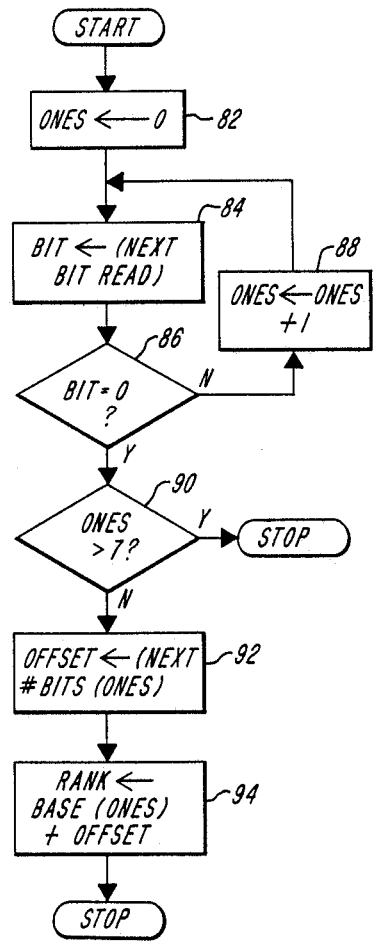
FIG. 6 is a flow chart of the decoding steps utilized by the system and method of the present invention.

The decoding procedure utilized by the receiver after it receives the compressed data will now be described with reference to FIG. 6. Initially, in step 82 that there are no "1" bits, and in step 84 the system fetches the next incoming bit. The system counts bits in steps 86 and 88 until the terminating "0" is detected. Once the correct prefix is determined, the suffix is then decompressed. Initially, in step 90 the end of table condition is tested for and if not found, the suffix is read in "least significant bit first" order. The suffix is then added to the base in step 94, and the receiver is then ready for the next prefix.

As discussed above, the Coding Table is preferably not generated after each character is processed. Rather, the system generates the Coding Table based on the values of the probability pointers after every sixteenth character is processed, while the bubbler and probability pointers get updated after each character. The Coding Table is regenerated only every sixteenth character because the process of regeneration is relatively time consuming. The bubbler and probability pointers may, however, also be updated periodically rather than after each character is processed, and the Coding Table may be regenerated after each input character is processed.

The Coding Table is generated by fitting the integer part of the probability pointers into whole powers of 2 of characters in the Char table. The fractional, LSB portion of the pointers, is not considered when creating the Coding Table. The span of characters between each coding range and the next probability pointer is rounded to the nearest power of 2 in order to determine the next coding range. This power of 2 is the number of bits in the suffix for each coding range and it determines the base rank of the next coding range.

For example, suppose that the data passing through the compressor is totally random, i.e. each of the 256 characters is equally likely to occur. In this case the probability pointers tend to be near the same point in the Char table as their probabilities; the ½ pointer will be halfway up, the ¼ pointer will be a quarter of the way to the top, etc. The following set of probability pointers was generated by just such random data.

TABLE 6

| FLAT FREQUENCY DISTRIBUTION PROBABILITY POINTERS | |
|---|---|
| Number | Value |
| 0 | 130 |
| 1 | 198 |
| 2 | 228 |
| 3 | 241 |
| 4 | 247 |
| 5 | 251 |
| 6 | 254 |

The "span" of pointer "0" is from rank 0 to rank 129, a total of 130 rankings. 128 is the nearest power of 2 to 130 so coding range 0 will have 128 rankings in a 7 bit suffix ($2^7 = 128$). This covers ranks 0–127, so that the base of the next range will be 128. At this point, the Coding table is:

TABLE 7

| Range | Base Rank | # Bits |
|---|---|---|
| 0 | 0 | 7 |
| 1 | 128 | |
| 2 | | |

TABLE 7-continued

| Range | Base Rank | # Bits |
|---|---|---|
| 3 | | |
| 4 | | |
| 5 | | |
| 6 | | |
| 7 | | |

Pointer 1 is 198, and the base of range 0 is 128, so the span of pointer 1 is 198−128 or 70. 64 is the nearest power of 2 to 70, and six bits will count 64 ranks, so range 1 will have six bits in the suffix. 64 ranks will cover rank 129-191 so the base rank of range 2 will be 192. The Coding table now appears

TABLE 8

| Range # | Base Rank | # Bits |
|---|---|---|
| 0 | 0 | 7 |
| 1 | 128 | 6 |
| 2 | 192 | |
| 3 | | |
| 4 | | |
| 5 | | |
| 6 | | |
| 7 | | |

Finding the "nearest power of 2" to the span, is accomplished with a similar function to the logarithm, to the base of 2, of the span. This function, called LOG2() function, finds the nearest power of 2 to the span on the number line according to:

TABLE 9

| Span | LOG2 (Span) | Nearest power of 2 |
|---|---|---|
| 192 to 256 | 8 | 256 |
| 96 to 192 | 7 | 128 |
| 48 to 95 | 6 | 64 |
| 24 to 47 | 5 | 32 |
| 12 to 23 | 4 | 16 |
| 6 to 11 | 3 | 8 |
| 3 to 5 | 2 | 4 |
| 2 | 1 | 2 |
| 0 to 1 | 0 | 1 |

This function can be quickly determined by looking up the value in a 256 entry table. In an alternate embodiment a slightly slower, but more memory efficient method, utilizes a table with just the lower bound of each span and counts entries in the table to find the LOG2(Span).

A Coding Table is complete when all 256 possible ranks are assigned to a coding range. The "span" of the last probability pointer is always counted as 256 rankings which usually causes the last coding range to have "#Bits" of 8.

TABLE 10

| Range # | Base Rank | # Bits |
|---|---|---|
| 0 | 0 | 7 |
| 1 | 128 | 6 |
| 2 | 192 | 5 |
| 3 | 224 | 4 |
| 4 | 240 | 3 |
| 5 | 248 | 2 |
| 6 | 252 | 1 |
| 7 | 254 | 8 |

The completed table for the random data probability pointers is shown above. With this totally random data stream, the total symbol length of the prefix and suffix will always be 8 bits, exactly what would be expected for data with 256 equally likely characters. The only exception is the coding of ranks 254 and 255, due to the forced 8 bit suffix.

Under some circumstances, the last probability pointer is not used because the earlier coding ranges already cover all 256 possible rankings. In these cases the last used coding range does not have a "#Bits" of 8.

Figure 7:
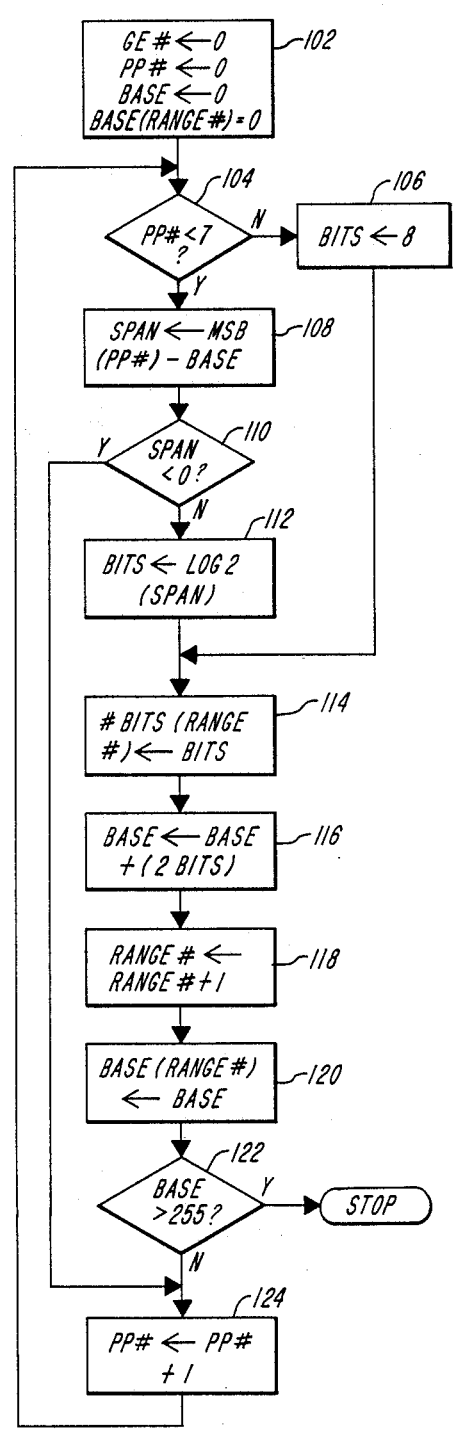
FIG. 7 is a flow chart of the procedure for constructing a coding table from the probability pointers updated in FIG. 4.

Referring to FIG. 7, the procedure utilized by the system for creating the Coding Table will now be described. Initially, the range number, the pointer number, the first base rank, and the base of range 0 are all initialized to 0 in step 102. Next in step 104, the pointer number is tested, and if it is greater than 6, the last pointer has been detected, and the length of the suffix is forced to be 8 bits to cover all remaining bits in step 106. If one of pointers 0 through 6 is being processed, the span of the range is then determined in step 108 provided that there is no pointer overlap and the span is greater than 0. The suffix length for that range is determined as the nearest power of 2 in step 112 and this number of bits is then placed in the "#BITS" table in step 114. The next base rank is then determined in step 116, and the range number is incremented in step 118. This base is the new base for the next range as determined in step 120, and if the base is greater than 255 processing concludes as there are no more ranks needing a position in the Coding table. If the range is less than 255, the next pointer is then determined in step 124 and processing continues for this next pointer.

Once the coded symbols for the ranks have been determined, they must be transmitted to the receiver and decompressed. Most commonly available protocols transfer data in units of 8 bit bytes. The variable length patterns of the symbols, however, are not generated in convenient 8 bit units, but must instead be shifted into bytes, one bit at a time, with a software shift register.

The software shift register used for this purpose in the present invention packs the bits into 8 bit bytes "backwards". For example, if the symbol to be sent was "11110101", the output byte would be "10101111" (AF hex), with the "first" bit in the least significant position and the "last" bit in the most significant position. In this manner the suffix value has now been reversed twice. This choice of order is arbitrary, but it does have the incidental effect that the resulting synchronous bit stream is in "forward" order with prefixes always preceding suffixes, since bytes are normally transmitted in the order D0, D1 . . . D7, with the least significant bit first.

If a symbol such as "11111001101" is to be transmitted, the first byte will be "10110011" (B3 hex) with the shift register still holding an additional three bits "xxxxx111". If the next symbol is "0000" then "x0000111" will be in the shift register, still one bit short of the eight bits needed for transmission. If finally the symbol "1011" is ready to be sent, the byte "10000111" (87 hex) will be sent, with "xxxxx110" now in the shift register.

On the decompression side, a decoded character is output after each symbol is received and decoded through the reverse process. Symbols whose bits are contained in more than one transmitted byte cannot be output until all the remaining bits are "pushed out" of the shift register by the bits of the next symbol. If there is no more incoming data to produce symbol bits to perform this pushing out, the remaining bits of the last symbol can be "stranded" in the shift register of the transmitter, untransmittable because they do not yet form a full byte. The solution to this problem is to provide a special symbol, with no useful information content, solely to "push out" these remaining bits. This push out symbol is "111111110" which is a total of 9 bits in length, so any stray bits will always be flushed out of the eight bit shift register. In the example above where "xxxxx110" was waiting to be transmitted, the pushout symbol would cause "11111110" (FE hex) to be transmitted, and leave "xxxx0111", the latter 4 bits of the pushout symbol, in the shift register. It does not matter whether or not these bits are ever transmitted since they carry no information and will be thrown away by the receiver. The pushout symbol is sent once whenever there are remaining bits in the shift register, and no data-carrying symbols to push them out. By definition this occurs only when there is no data to send, so this use of an extra symbol does not subtract from the compression performance.

When the receiver gets the pushout symbol (because later symbols push it out), it will interpret it as a prefix with 8 "1" bits followed by a "0 bit". Since the number of "1" bits in the prefix determines the coding range to use, and the highest numbered coding range is 7, the pushout symbol is easily recognized as specifying a non-existent coding range and is therefore ignored.

An alternate embodiment of the system of the present invention includes run length encoding which effectively codes repeated sequences of the same input character, such as strings of spaces. Instead of sending a separate symbol for each repeated character, a count of the total number of repeated characters is sent.

After any character is sent three times in a row, the next symbol sent must be the count of the additional repeats of the same character. The three initial characters are processed and sent normally, followed by the count of additional characters. If there are no more of the same characters to be sent, then the count is zero. The count symbol is sent as if it were rank, and the count symbol for five additional characters is that symbol which would be used to code the character whose current rank is 5. The maximum run length encoding count is 252. If there are more repeated characters, additional run length encoding sequences are sent with the first three remaining repeated characters coded and sent normally, followed by another count.

The requirement for a count symbol after three repeated characters is not affected by timing between characters or transmission of a pushout symbol. It is possible for a pushout symbol to be sent between the third repeated character and the count symbol (which need not be zero in such a case). The count symbol itself does not affect the bubbler, probability pointers or coding table regeneration. In a sense, it operates in a fashion similar to the pushout symbol.

The simplest and best way to implement run length encoding is to count the number of repeated characters before encoding any of the characters. If the count is three or greater, the run length encoding count is added after the first three symbols and it is omitted otherwise.

Before the compression system can be used, both the transmitter 12 and receiver 13 must identically initialize all variables and tables associated with the state of the compression/decompression system. Specifically, the shift register, Rank table, Char table, probability pointers, and Coding Table must be set in a standard initial state, such as described below. In a duplex system, the initialization is duplicated for each side of the connection.

The shift register is initially set as empty. The Rank table, which maintains rankings for each of the 256 possible characters, is initially set with the characters 0-127 having ranks 127-0, and the characters 128-255 having ranks 128-255. Thus, the first half of the table is backwards, and the latter half forwards. This organization has three principal advantages. First, it is very simple and therefore can be computed rather than stored in a permanent table. Second, it places the characters that occur most often in ASCII text near the top of the rankings, lessening the adaptation time for this common type of data. Finally, in this state the contents of the Char table, which is directly derived from the Rank table, is identical to the Rank table so the initial state of each can be computed with the same routine.

TABLE 11

| INITIAL RANK TABLE | | INITIAL CHAR TABLE | |
|---|---|---|---|
| Character | Rank | Rank | Character |
| 0 | 127 | 0 | 127 |
| 1 | 126 | 1 | 126 |
| 2 | 125 | 2 | 125 |
| 3 | 124 | 3 | 124 |
| 4 | 123 | 4 | 123 |
| . | . | . | . |
| . | . | . | . |
| 124 | 3 | 124 | 3 |
| 125 | 2 | 125 | 2 |
| 126 | 1 | 126 | 1 |
| 127 | 0 | 127 | 0 |
| 128 | 128 | 128 | 128 |
| 129 | 129 | 129 | 129 |
| 130 | 130 | 130 | 130 |
| 131 | 131 | 131 | 131 |
| . | . | . | . |
| . | . | . | . |
| 252 | 252 | 252 | 252 |
| 253 | 253 | 253 | 253 |
| 254 | 254 | 254 | 254 |
| 255 | 255 | 255 | 255 |

The probability pointers are each initialized to a value of 32768, pointing exactly at rank 128.0:

TABLE 12

| INITIAL PROBABILITY POINTERS | | |
|---|---|---|
| Number | MSB | LSB |
| 0 | 128 | 0 |
| 1 | 128 | 0 |
| 2 | 128 | 0 |
| 3 | 128 | 0 |
| 4 | 128 | 0 |
| 5 | 128 | 0 |
| 6 | 128 | 0 |

The table of initial probability pointers is trivial to implement and results in an initial Coding Table that codes the entire ASCII set in eight bits each, the length the characters would be without the compression system. The initial Coding Table can be derived from the probability pointers with the usual algorithm. The resulting table is:

TABLE 13

| Range # | Base Rank | # Bits |
|---|---|---|
| 0 | 0 | 7 |
| 1 | 128 | 0 |
| 2 | 129 | 8 |
| 3 | (256) | |
| 4 | | |
| 5 | | |
| 6 | | |

TABLE 13-continued

| Range # | Base Rank | # Bits |
| --- | --- | --- |
| 7 | | |

A counter may be used to determine when to regenerate the Coding Table from the probability pointers. If a counter is utilized, a preferred embodiment initializes both the Coding Table and the counter by setting the counter as if the sixteenth character had just been processed, requiring regeneration, and then using the normal routine to generate the initial table and reset the counter.

While the foregoing invention has been described with reference to its preferred embodiments, various alterations and modifications will occur to those skilled in the art. All such alterations and modifications are intended to fall within the scope of the appended claims.

What is claimed is:

1. A system for compressing data comprising:
   means for receiving data characters to be recoded into variable length symbols;
   means for storing a representation of each data character in a character table, the representations being stored substantially in order of a determined probability of the occurrence of each data character;
   means for storing a unique rank for each data character in a rank table of probabilities of occurrence of each data character, a number of available ranks corresponding to a number of unique data characters;
   means for updating said character and rank tables after the system receives a data character, said means for updating said character table determines a location a predetermined percentage of places toward the top of said character table from said stored representation of said received data character and swaps the rank of the received character with the rank of the character in the determined location;
   means for recoding each of said received data characters into a variable-length symbol including a prefix part and a suffix part, said prefix part representing a base rank for a character in a range of ranks in said character table and said suffix representing an offset from said base rank for said character.

2. The system for compressing data of claim 1 wherein said means for determining a location a predetermined percentage of places toward the top of said character table further comprises means for testing if said determined location is a whole number and if said determined location includes a fractional number rounding said determined location to the next whole number location.

3. The system for compressing data of claim 1 further comprising a set of probability pointers for dividing said ranks into said ranges.

4. The system for compressing data of claim 3 wherein each range has one half the probability of the previous range.

5. The system for compressing data of claim 4 wherein there are 256 available characters and 7 probability pointers for dividing said 256 available characters into 8 probability ranges.

6. The system for transmitting or storing data in a compressed format of claim 3 further comprising means for updating said character and rank tables and said probability pointers after every N data characters are received by the system N being a predetermined number of data characters 7. The system for compressing data of claim 3 further comprising means for updating said probability pointers so that if the rank of a received character is greater than a last probability pointer, said last probability pointer is set equal to the rank of the received character.

8. The system for compressing data of claim 1 further comprising means for updating said character table and said rank table based on the received character after each character has been received by the system.

9. The system for compressing data of claim 1 further comprising a Coding table including entries for a plurality of ranges of ranks, each of said entries for each range including the base rank and the number of rankings in each range.

10. The system for compressing data of claim 9 further comprising means for updating said Coding table, after every N data characters are received by the system, based on the values of said probability pointers, N being a predetermined number of data characters.

11. The system for compressing data of claim 1 further comprising means for decompressing said variable length symbols including:
    means for receiving said variable length symbols defining a rank of the probability of occurrence of a character;
    means for decoding said symbols based on a dynamic Coding table maintained by said decompressing means;
    means for updating probability pointers defining ranges of ranks of probabilities of the occurrence of each character based on the received symbol.

12. The system for compressing data of claim 1 wherein said means for updating said character table comprises means for dividing the rank of said received character by 8 to determine a distance to move the rank toward the top of said character table.

13. The system for compressing data of claim 1 wherein said prefix part comprises a series of "1" s followed by a "0".

14. The system for compressing data of claim 13 wherein the number of "1"s in said series of "1"s represents the range number of said range of ranks in said character table.

15. A method of compressing data comprising the steps of:
    receiving data characters of an input data stream;
    providing a means for storing the relative frequency of occurrence of each data character;
    modifying the relative frequency of occurrence of each received data character;
    ranking the frequencies of occurrence of each data character and modifying the rankings after a data character is received;
    providing probability pointers into a table of ranks of the frequencies and modifying said probability pointers after a data character is received and said rankings are modified.

16. The method of compressing data of claim 15 wherein said step of modifying the rankings of frequencies comprises dividing the ranking of the input character by a preselected constant to calculate a new ranking and assigning the new ranking to the received character and assigning the previous ranking of the input character to the character previously assigned said new ranking.

17. The method of compressing data of claim 15 further comprising the step of recording each of said data characters into a variable length symbol including a prefix part and a suffix part, said prefix part representing a base rank and a range of rank, and said suffix representing an offset from said base rank.

18. The method of compressing data of claim 17 wherein said prefix part comprises a series of "1"s followed by a "0".

19. The method of compressing data of claim 18 wherein the number of "1"s in said series of "1"s represents the range number of said range of ranks.

20. The method of compressing data of claim 15 wherein said step of modifying the rankings of frequencies further comprises the step of testing if a number representing said determined location is a whole number and if said determined location includes a fractional part rounding said determined location to the next whole number location 21. The method of compressing data of claim 15 wherein said probability pointers divide said table of ranks into ranges of ranks and wherein each probability range has one-half the probability of the previous range.

22. The method of compressing data of claim 15 further comprising the step of creating a coding table including entries for a plurality of range of ranks, each of said entries for each range including a base rank and the number of rankings in each range.

23. The method of compressing data of claim 22 further comprising the steps of updating said coding table after every N characters are received by the system, based on the values of said probability pointers, N being a predetermined number of characters.

24. The method of compressing data of claim 15 further comprising the step of decompressing said variable length symbols wherein said decompressing step includes:

receiving said variable length symbols defining a rank of the probability of occurrence of a character;

decoding said symbols based on a dynamic coding table maintained by a decompressor;

updating probability pointers defining ranges of ranks of probabilities of the occurrence of each character based on the received symbol.

25. The method of compressing data of claim 15 wherein said step of modifying said probability pointers comprises, if the rank of a received character is greater than a second to last probability pointer, setting said second to last probability pointer equal to the rank of the received character.

* * * * *